US011456751B1

(12) United States Patent
Bahr et al.

(10) Patent No.: US 11,456,751 B1
(45) Date of Patent: Sep. 27, 2022

(54) OVENIZED CRYSTAL OSCILLATOR REFERENCE FREQUENCY SIGNAL GENERATOR

(71) Applicant: Texas Instruments Incorporated, Dallas, TX (US)

(72) Inventors: Bichoy Bahr, Allen, TX (US); Baher Haroun, Allen, TX (US); Swaminathan Sankaran, Allen, TX (US); Juan Alejandro Herbsommer, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/536,924

(22) Filed: Nov. 29, 2021

(51) Int. Cl.
| | | |
|---|---|---|
| *H03L 7/099* | (2006.01) | |
| *H03B 5/32* | (2006.01) | |
| *H03L 7/08* | (2006.01) | |
| *H03L 7/14* | (2006.01) | |
| *H03L 7/10* | (2006.01) | |
| *H03L 7/06* | (2006.01) | |
| *H03L 1/00* | (2006.01) | |
| *H03L 1/02* | (2006.01) | |
| *H03L 7/00* | (2006.01) | |

(52) U.S. Cl.
CPC ............... *H03L 7/099* (2013.01); *H03B 5/32* (2013.01); *H03L 1/00* (2013.01); *H03L 1/022* (2013.01); *H03L 7/00* (2013.01); *H03L 7/06* (2013.01); *H03L 7/08* (2013.01); *H03L 7/104* (2013.01); *H03L 7/143* (2013.01)

(58) Field of Classification Search
CPC . H03L 7/099; H03L 1/00; H03L 1/022; H03L 7/143; H03L 7/104; H03L 7/08; H03L 7/06; H03L 7/00; H03L 7/26; H03B 5/32
USPC .................. 331/158, 2, 46, 176, 3, 94.1, 66
See application file for complete search history.

(56) References Cited

U.S. PATENT DOCUMENTS 7,764,131 B1 * 7/2010 Seth ........................ H03L 1/027
331/46

* cited by examiner

*Primary Examiner* — Arnold M Kinkead
(74) *Attorney, Agent, or Firm* — Michael A. Davis., Jr.; Charles A. Brill; Frank D. Cimino

(57) ABSTRACT

A reference frequency signal generator comprises a plurality of ovenized reference crystal oscillators (OCXOs) having different turn-over-temperatures, a selector logic circuit coupled to outputs of the OCXOs, a temperature sensor, and a controller coupled to an output of the temperature sensor. The selector logic circuit outputs one of the outputs of the OCXOs based on a control signal from the controller. The controller also generates control signals for the OCXOs. In some implementations, the reference frequency signal generator includes a phase-locked loop or a fractional output divider coupled to the output of the selector logic circuit and configured to receive a calibration signal from the controller.

24 Claims, 12 Drawing Sheets

OVENIZED CRYSTAL OSCILLATOR REFERENCE FREQUENCY SIGNAL GENERATOR

BACKGROUND

Ovenized crystal oscillators (OCXOs) operate at a turn-over-temperature (TOT) based on the characteristics of the crystal. The frequency drift of an OCXO is comparatively low at temperatures around the TOT, such that the frequency of the OCXO is more stable and more precise than other kinds of crystal oscillators. However, maintaining the TOT for the crystal can be power-intensive. For example, an OCXO has a TOT of approximately 110 degrees)(° Celsius (C), and the expected environmental temperature of the OCXO varies between −40° C. and 105° C. based on the time of day, season of the year, geographical location, and the like. The TOT of 110° C. is a threshold amount higher than the higher environmental temperature of 105° C. to ensure stable performance of the OCXO. However, maintaining the TOT at 110° C. while the environmental temperature is −40° C. is prohibitively power-intensive.

SUMMARY

A reference frequency signal generator comprises a plurality of ovenized reference crystal oscillators (OCXOs) having different turn-over-temperatures (TOTs), a selector logic circuit, a temperature sensor, and a controller. The selector logic circuit is coupled to the plurality of OCXOs and outputs a particular OCXO output based on a control signal from the controller. The temperature sensor measures an environmental temperature of the reference frequency signal generator. The controller receives the environmental temperature from the temperature sensor and determines the environmental temperature is within an operating temperature range of a particular OCXO based on the respective TOT. The controller causes the particular OCXO to generate the particular OCXO output, and generates a control signal to cause the selector logic circuit to output the particular OCXO output.

In some implementations, the reference frequency signal generator also includes a phase-locked loop (PLL) configured to calibrate the particular OCXO output based on a calibration signal from the controller. The controller generates the calibration signal based on a trim value associated with the particular OCXO.

In some embodiments, the particular OCXO is a first particular OCXO with a first particular OCXO output, and the controller receives an updated environmental temperature from the temperature sensor and determines the updated environmental temperature sensor is within the operating temperature range of the first particular OCXO and within an operating temperature range of a second particular OCXO based on the respective TOT. The controller causes the second particular OCXO to turn on and generate a second particular OCXO output, and generates a control signal to cause the selector logic circuit to output the second particular OCXO output. The controller can also cause the first particular OCXO to turn off.

The selector logic circuit is a first selector logic circuit with a first control signal in some implementations, and the reference frequency signal generator includes a second selector logic circuit and a phase detector. The second selector logic circuit is coupled to the plurality of OCXOs and configured to output the first and second particular OCXO outputs based on a second control signal from the controller. The phase detector receives the first and second particular OCXO outputs from the second selector logic circuit and generates a phase difference signal. The controller receives the phase difference signal and generates the first control signal to cause the first selector logic circuit to output the second particular OCXO output in response to the phase difference signal satisfying a threshold criterion.

In some implementations, the controller causes the phase detector to turn off. In some embodiments, the reference frequency signal generator also includes a third selector logic circuit and a molecular clock loop. The third selector logic circuit outputs one of the output of the first selector logic circuit and the output of the second selector logic circuit based on a third control signal from the controller. The molecular clock loop is coupled to an output of the third selector logic circuit and generates a frequency calibration signal. The controller receives the frequency calibration signal and adjusts one of a first operating parameter of the first particular OCXO and a second operating parameter of the second particular OCXO.

In some embodiments, the selector logic circuit is a first selector logic circuit with a first control signal, and the reference frequency signal generator also includes a second selector logic circuit and a synchronizing PLL. The second selector logic circuit is coupled to the plurality of OCXOs and outputs the second particular OCXO based on a second control signal. The synchronizing PLL synchronizes a frequency and phase of the first and second particular OCXO outputs. The controller generates the first control signal to cause the first selector logic circuit to output the second particular OCXO output in response to the frequency and phase of the first and second particular OCXO outputs being synchronized.

DETAILED DESCRIPTION

Figure 1:
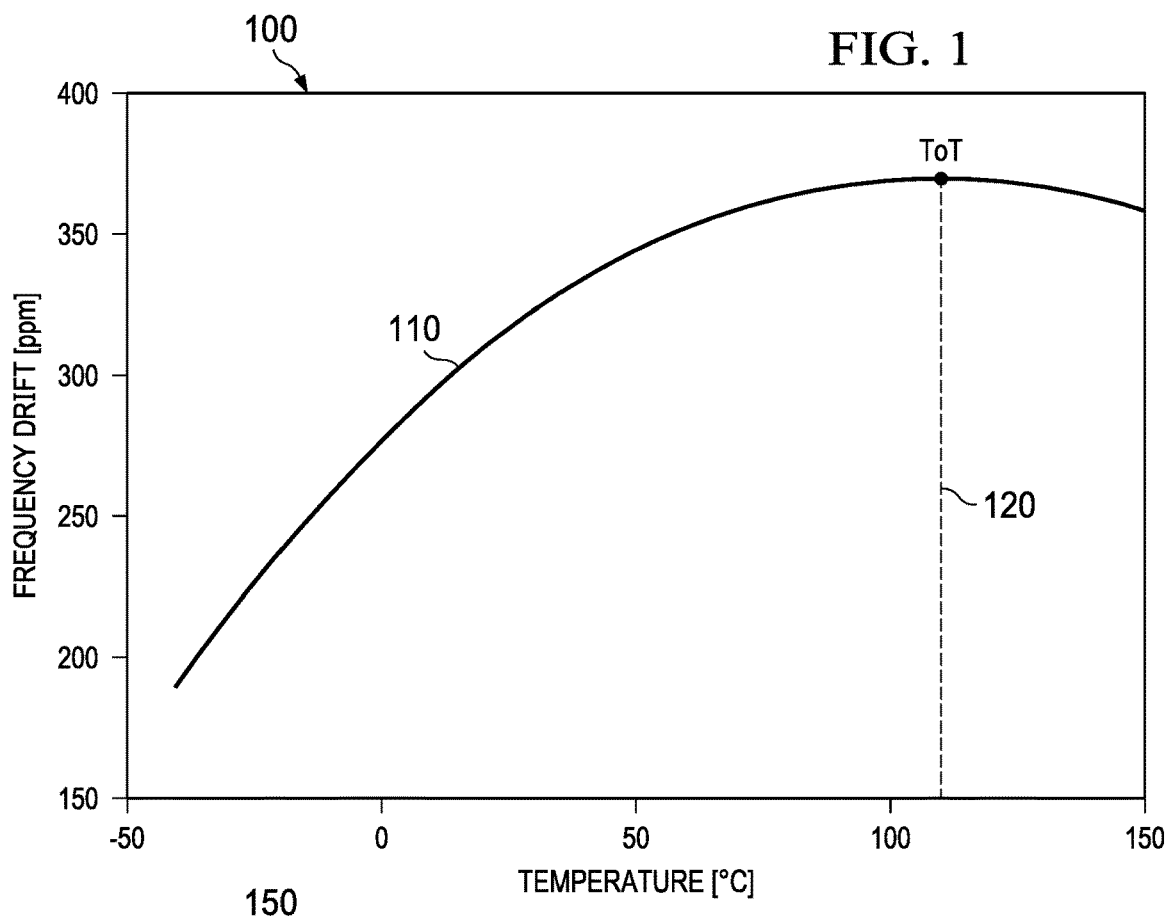
FIG. 1 shows graphs of the behavior of an ovenized reference crystal oscillator (OCXO) over temperature.
Figure 1:
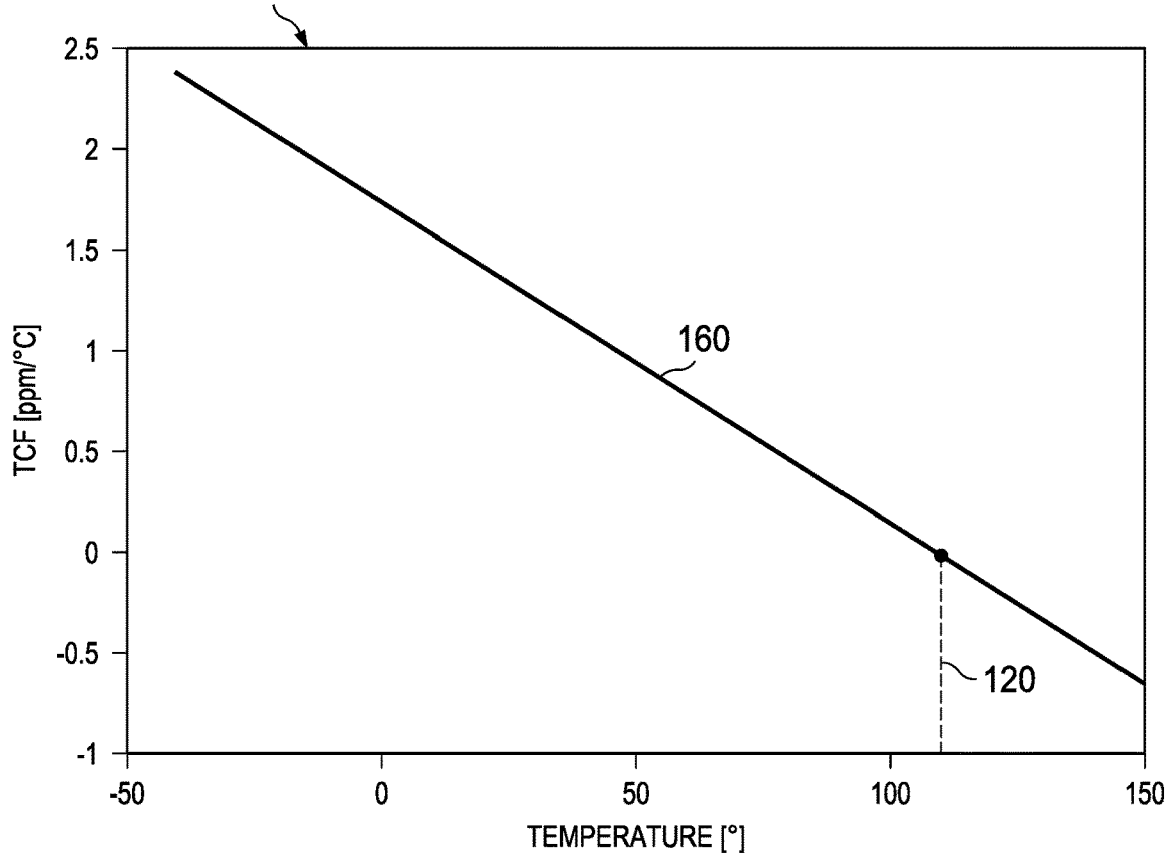

The same reference number is used in the drawings for the same or similar (either by function and/or structure) features.

The described reference frequency signal generators include a plurality of ovenized reference crystal oscillators (OCXOs) having different turn-over-temperatures (TOTs). The different TOTs and respective operating temperature ranges for the OCXOs can be chosen to cover an expected environmental temperature range, and the reference frequency signal generators transition from one OCXO to another based on the environmental temperature range.

FIG. 1 shows graphs of the behavior of an ovenized reference crystal oscillator (OCXO) over temperature. Graph 100 shows the frequency drift 110 over temperature of an example OCXO. The frequency drift 110 is an arc with a comparatively flat region around the OCXO's turn-over-temperature (TOT) 120 at which the OCXO is operated. For the example OCXO, the TOT 120 is approximately 110 degrees (°) Celsius (C). Graph 150 shows the temperature coefficient of the resonant frequency (TCF) 160 of the OCXO. The OCXO and respective TOT 120 can be chosen based on the expected environmental temperature Tamb, such that the TOT 120 is a threshold amount higher than Tamb. The threshold amount can be chosen to reduce the amount of power required to maintain the TOT 120 for the OCXO but ensure that the OCXO has stable performance at its TOT 120.

For example, the expected environmental temperature Tamb is 105° C., and the selected OCXO has a TOT 120 of 110° C. However in many implementations, the expected environmental temperature Tamb may vary, for example based on the time of day, season of the year, geographical location, and the like. For example, Tamb may vary between −40° C. and 105° C. The TOT 120 is 110° C., a threshold amount higher than the upper value of Tamb 105° C., to ensure stable performance of the OCXO but maintaining the TOT 120 at 110° C. while Tamb is −40° C. is prohibitively power-intensive.

Figure 2A:
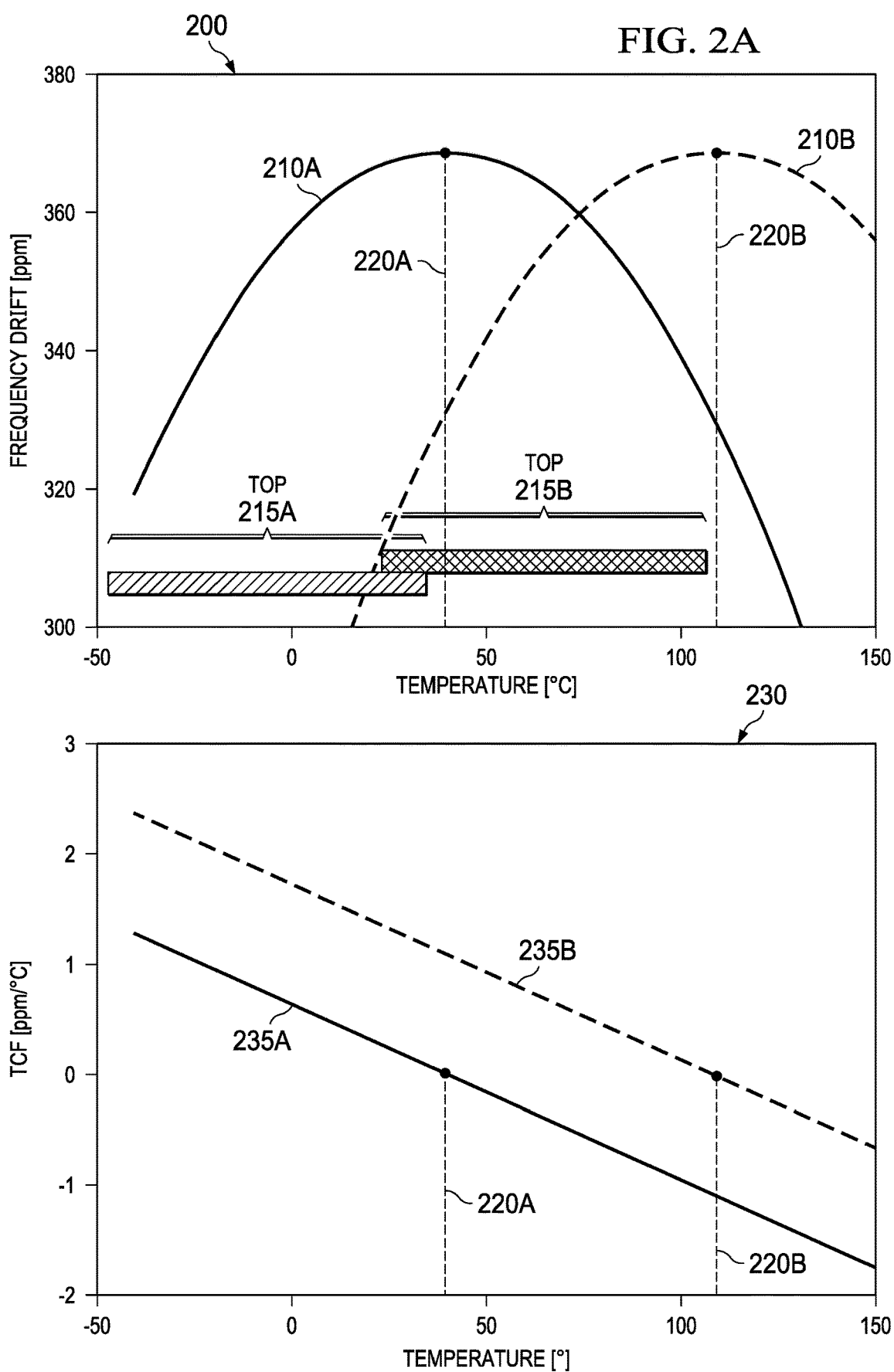
FIG. 2A shows graphs of the behaviors of two OCXOs working in tandem over temperature.

FIG. 2A shows graphs of the behaviors of two OCXOs working in tandem over temperature. Graph 200 shows the frequency drift 210A over temperature of a first OCXO and the frequency drift 210B over temperature of a second OCXO. The TOT 220A of the first OCXO is approximately 45° C., and the TOT 220B of the second OCXO is approximately 110° C. Graph 230 shows the TCF 235A of the first OCXO and the TCF 235B of the second OCXO.

For a large range of expected environmental temperatures Tamb, two or more OCXOs can be used in tandem to divide the range of temperatures into two operating regions. While the environmental temperature is in a first subset Top 215A of the range, the first OCXO provides the reference frequency signal, and the second OCXO can be turned off to conserve power in heating the crystal. While the environmental temperature is in a second subset Top 215b of the range, the second OCXO provides the reference frequency signal, and the first OCXO can be turned off to conserve power in heating the crystal.

Returning to the example in which the expected environmental temperature Tamb ranges from −40° C. to 105° C., the first subset Top 215A is between −40° C. and 45° C., and the second subset Top 215B is between 40° C. to 105° C. While Tamb is in the first subset Top 215A, the first OCXO provides the reference frequency signal. As the environmental temperature Tamb increases towards the higher temperatures of Top 215A, the second OCXO turns on and the crystal is heated such that the second OCXO is heated and stabilized before Tamb increases into the second subset Top 215B. For example, Tamb is expected to change at a rate of 1° C. per minute, and the second OCXO stabilizes in three minutes. The second OCXO turns on at approximately 40° C. The overlapping temperatures in Top 215A and Top 215B ensure that the OCXOs are stable before handover from one OCXO to the other.

Figure 2B:
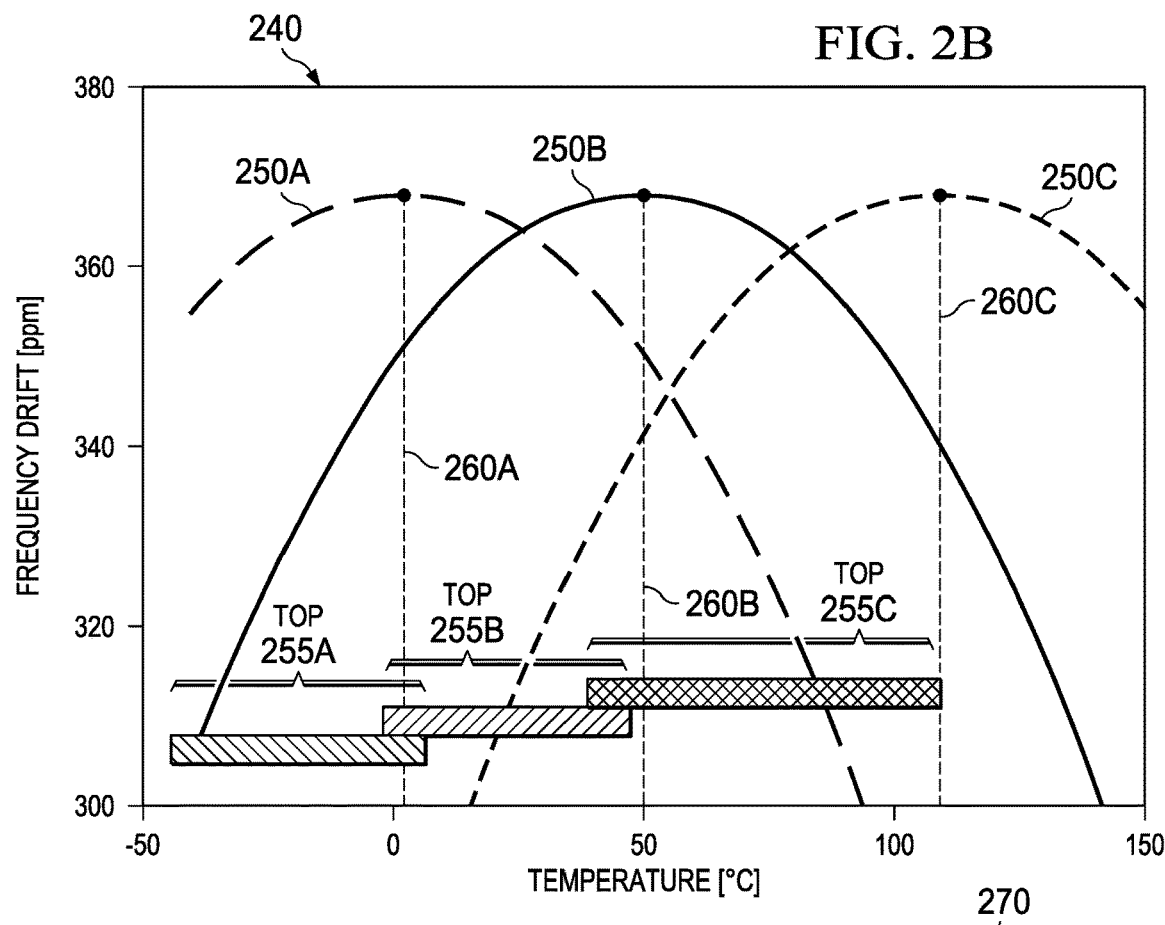
FIG. 2B shows graphs of the behaviors of three OCXOs working in tandem over temperature.
Figure 2B:
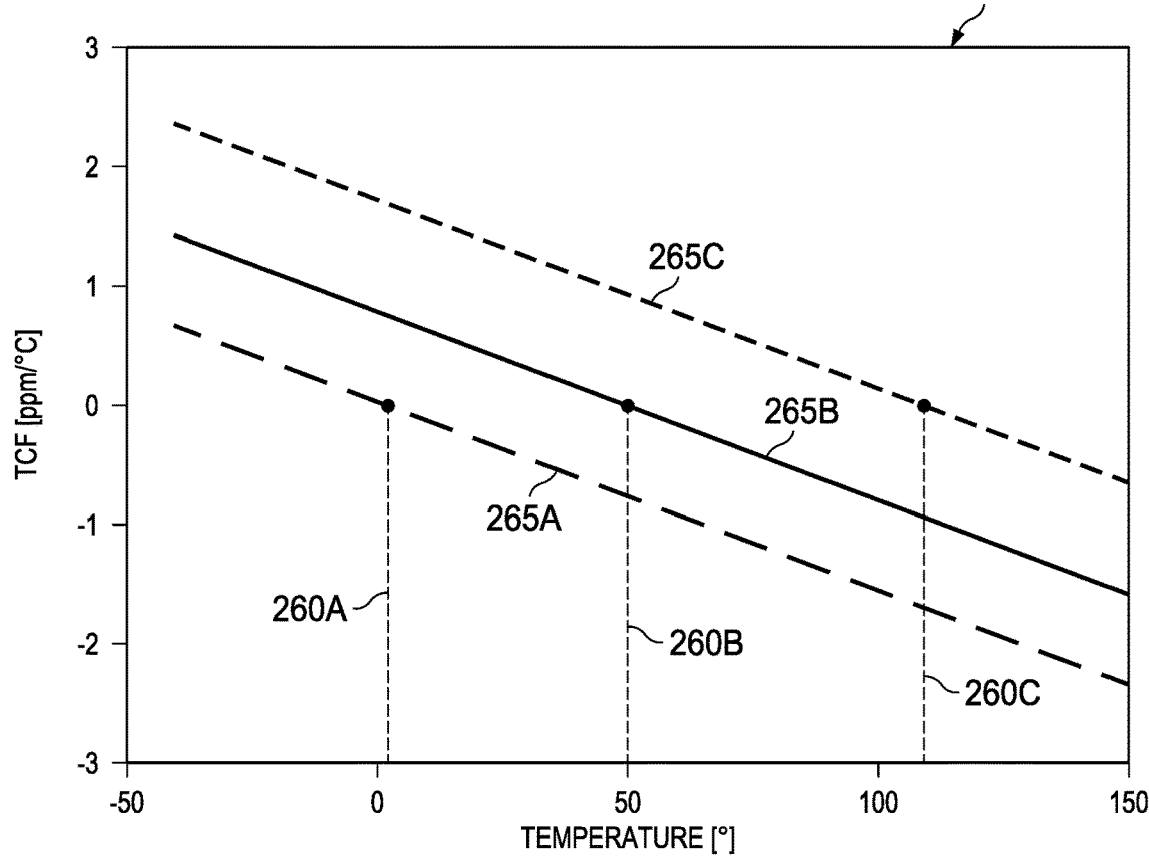

FIG. 2B shows graphs of the behaviors of three OCXOs working in tandem over temperature. Graph 240 shows the frequency drifts 250A, 250B, and 250C over temperature of three OCXOs. The TOT 260A of the first OCXO is approximately 5° C., the TOT 260B of the second OCXO is approximately 45° C., and the TOT 260C of the third OCXO is approximately 110° C. Graph 270 shows the TCF 265A of the first OCXO, the TCF 265B of the second OCXO, and the TCF 265C of the third OCXO. In this example, three OCXOs are used in tandem to divide the range of temperatures into three operating regions Top 255A, Top 255B, and Top 255C. The number of OCXOs used to provide the reference frequency signal can be based on the expected range of environmental temperatures, the power requirements of the system, the frequency drift tolerance of the system, and the like.

Returning to the example in which the expected environmental temperature Tamb ranges from −40° C. to 105° C., the first subset Top 255A is between −40° C. and 5° C., the second subset Top 255B is between 0° C. and 45° C., and the third subset Top 255C is between 40° C. and 110° C. The amount of overlap between Top 255A, Top 255B, and Top 255C can be chosen based on the length of time to heat up and stabilize the crystals in the OCXOs, the expected rate of change of the environmental temperature Tamb, and the like. Further, the amount of overlap can be chosen to reduce the length of time that two OCXOs are on at the same time and to incorporate hysteresis so that the system does not transition back and forth between two OCXOs in the transition temperatures.

Figure 3:
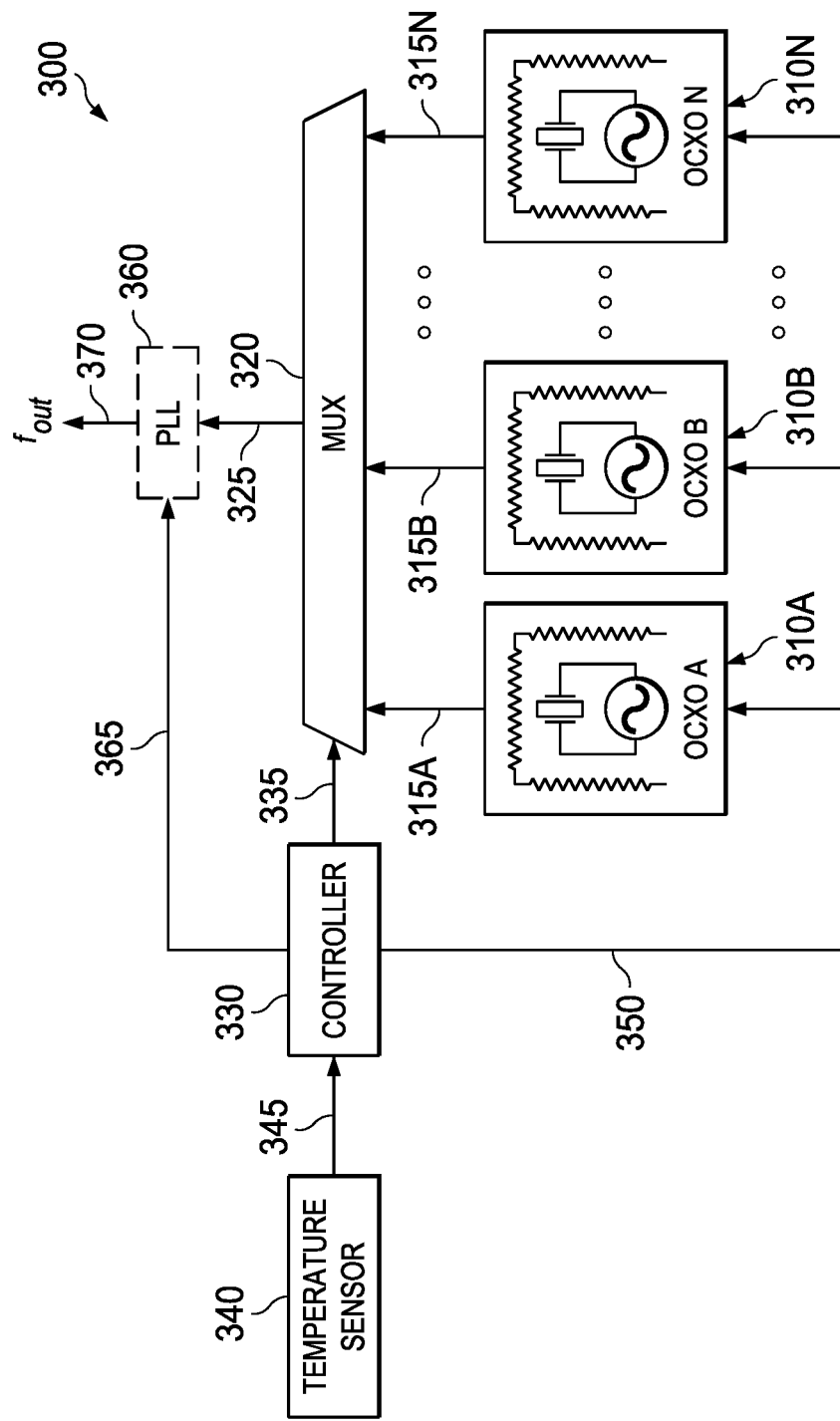
FIG. 3 illustrates an example reference frequency generator including multiple OCXOs.

FIG. 3 illustrates an example reference frequency generator 300 including multiple OCXOs 310A-N. For ease of illustration, the reference frequency generator 300 is described herein with reference to FIG. 2B. The reference frequency generator 300 includes the multiple OCXOs 310A-N, a multiplexor (MUX) 320, a controller 330, a temperature sensor 340, and an optional phase-locked loop (PLL) 360. The outputs of the OCXOs 310A-N provide the respective frequency signals 315A-N and are coupled to inputs of MUX 320, which can be a glitch-free MUX in some examples. The MUX 320 selects a particular OCXO 310 based on a control signal 335 from the controller 330 and outputs the respective frequency signal 315 as the output 325.

In implementations with the optional PLL 360, the PLL 360 can correct for small frequency changes in output 325 from one OCXO 310 to another based on a frequency calibration signal 365 from controller 330. The frequency calibration signal 365 can be chosen to compensate for manufacturing tolerances in the OCXOs 310A-N and ensure a constant frequency in the reference frequency signal fout 370. In this example, the PLL 360 is a PLL, but in other implementation, a fractional output divider can be used instead. In implementations without the optional PLL 360, the output 325 is the reference frequency signal fout 370, and the controller 330 can calibrate the frequencies of the OCXOs 310A-N via control signals 350.

Temperature sensor 340 determines the environmental temperature of the reference frequency generator 300, and provides the measured temperature Tamb 345 to the controller 330. The controller 330 provides control signals 350 to the OCXOs 310A-N based on Tamb 345. For example, reference frequency generator 300 includes three OCXOs 310A-C with the characteristics shown in FIG. 2B. At a first time, Tamb 345 is approximately 20° C., in Top 255B. The controller 330 outputs control signals 350 to the OCXOs 310A-C to cause the second OCXO 310B to be turned on and provide the frequency signal 315B to MUX 320 and to cause OCXOs 310A and 310C to be turned off. The controller 330 outputs a control signal 335 to MUX 320 to cause MUX 320 to output the frequency signal 315B as the output 325.

At a second time, Tamb 345 is approximately 40° C. The controller 330 outputs control signals 350 to the OCXOs 310A-C to cause the first OCXO 310A to remain turned off and the second OCXO 310B to remain turned on and providing the frequency signal 315B. The control signals 350 also cause the third OCXO 310C to turn on and provide the frequency signal 315C to MUX 320. The controller 330 outputs a control signal 335 to MUX 320 to cause MUX 320 to continue outputting the frequency signal 315B as the output 325.

At a third time after the second time, the third OCXO 310C has heated to its TOT 260B, and the frequency signal 315C has stabilized. The Tamb 345 is approximately 45° C., and the controller 330 outputs control signals 350 to cause the first OCXO 310A to remain off and the third OCXO 310C to remain on. The control signals 350 also cause the second OCXO 3106 to turn off to conserve power. The controller 330 outputs a control signal 335 to MUX 320 to cause MUX 320 to output the frequency signal 315C as the output 325. In implementations with the optional PLL 360, the controller 330 also outputs a frequency calibration signal 365 to PLL 360 to trim any frequency variations between OCXO 310B and OCXO 310C.

Figure 4:
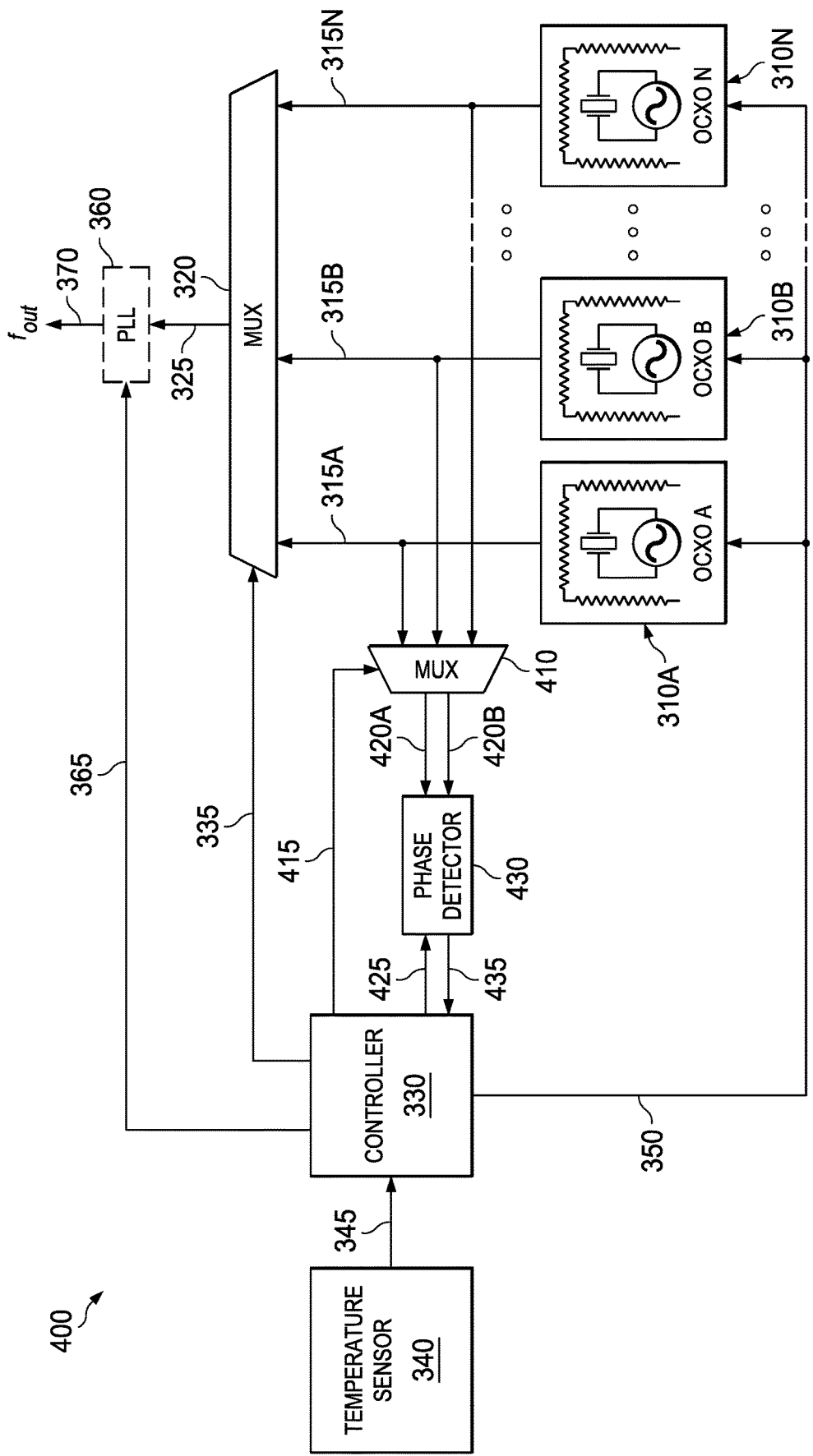
FIG. 4 illustrates the example reference frequency generator including multiple OCXOs shown in FIG. 3 with a phase detector.

FIG. 4 illustrates an example reference frequency generator 400 including multiple OCXOs and a phase detector. The reference frequency generator 400 is substantially the same as the reference frequency generator 300 shown in FIG. 3, but includes a second multiplexor 410 and a phase detector 430, which allows the reference frequency generator 400 to reduce the occurrence of phase jumps in fout 370 during transitions from one OCXO to another. Inputs of the second multiplexor 410 are also coupled to the outputs of the OCXOs 310A-N and receive the frequency signals 315A-N. The MUX 410 has two outputs 420A and 420B. Output 420A is used to provide the particular frequency signal 315 from the particular OCXO 310 that is currently being output from MUX 320 as the output 325. For output 420B, MUX 410 selects a second particular OCXO 310 based on a control signal 415 from the controller 330 and outputs the respective frequency signal 315. The control signal 415 indicates the second particular OCXO 310 to which the reference frequency generator 400 is switching.

The outputs 420A and 420B of MUX 410 are coupled to the phase detector 430, which receives a control signal 425 from the controller 330 and compares the phase of the output 420B to the phase of the output 420A. That is, the phase detector 430 compares the phase of the frequency signal 315 currently being used to generate fout 370 to the phase of the frequency signal 315 that the reference frequency generator 400 is transitioning to in order to provide fout 370. The phase detector 430 outputs a phase difference 435 to the controller 330. The controller 330 can then output an updated control signal 335 to the MUX 320 to transition from outputting one frequency signal 315A as the output 325 to outputting another frequency signal 315B as the output 325 when the phase difference between the frequency signals 315A and 315B satisfy a threshold criterion. For example, the phase difference between the frequency signals 315A and 315B can satisfy the threshold criterion while the phases of the frequency signals 315A and 315B are within a threshold difference from each other. If there is any small frequency difference between the OCXOs 310, the phases of the respective frequency signals 315 will accidentally align. The phase alignment repeats at the beat frequencies of the OCXOs 310 and satisfies the threshold criterion.

Returning to the example described herein with reference to FIG. 3 with three OCXOs 310A-C with the characteristics shown in FIG. 2B, at a second time Tamb 345 is approximately 40° C. The controller 330 outputs control signals 350 to the OCXOs 310A-C to cause the first OCXO 310A to remain turned off and the second OCXO 310B to remain turned on and providing the frequency signal 315B. The control signals 350 also cause the third OCXO 310C to turn on and provide the frequency signal 315C to MUX 320. The controller 330 outputs a control signal 335 to MUX 320 to cause MUX 320 to continue outputting the frequency signal 315B as the output 325. The controller 330 also outputs a control signal 425 to the phase detector 430 to cause it to power on.

At a third time after the second time, the third OCXO 310C has heated to its TOT 260B, and the frequency signal 315C has stabilized. The Tamb 345 is approximately 45° C., and the controller 330 outputs control signals 415 to MUX 410 to output the frequency signal 315B as the output 420A and the frequency signal 315C as the output 420B. The phase detector 430 compares a phase of the frequency signal 315C to the phase of the frequency signal 315b used to generate fout 370 and outputs a phase difference 435 to the controller 330. In response to the phase difference 435 indicating that the phase of the frequency signal 315C is within a threshold difference from the phase of the frequency signal 315B due to the accidental alignment of the phases, the controller 330 outputs control signals 350 to cause the first OCXO 310A to remain off, the third OCXO 310C to remain on, and the second OCXO 310B to turn off.

The controller 330 also outputs a control signal 335 to MUX 320 to cause MUX 320 to output the frequency signal 315C as the output 325. In implementations with the optional PLL 360, the controller 330 also outputs a frequency calibration signal 365 to PLL 360 to trim any frequency variations between OCXO 3106 and OCXO 310C. The controller 330 also outputs a control signal 425 to the phase detector 430 to cause it to power off and conserve power. The threshold phase difference can be chosen based on a frequency and phase tolerance of the system.

Figure 5:
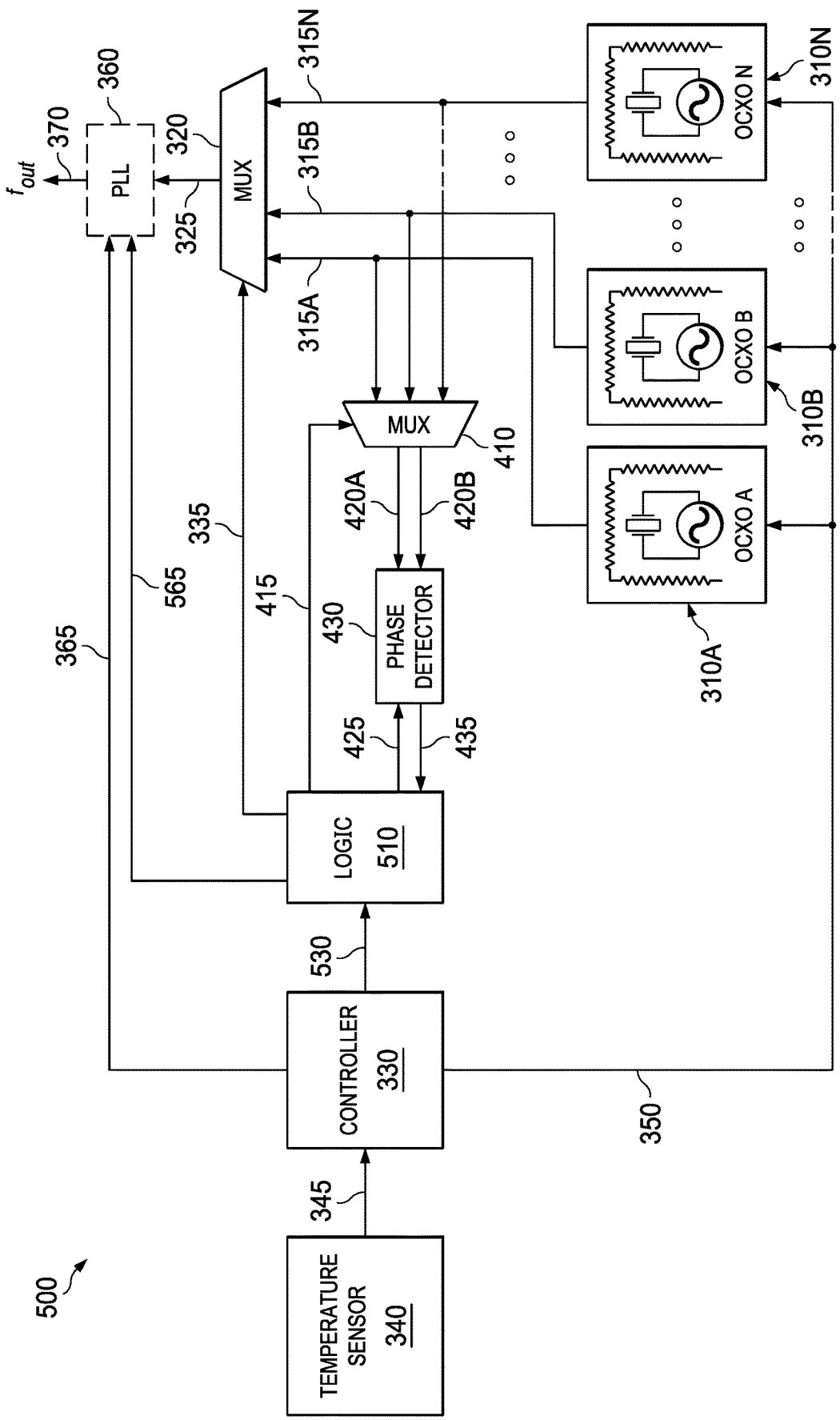
FIG. 5 illustrates the example reference frequency generator including multiple OCXOs and a phase detector shown in FIG. 4 with a high-speed logic circuit.

FIG. 5 illustrates an example reference frequency generator 500 including multiple OCXOs, a phase detector, and a high-speed logic circuit 510. The reference frequency generator 500 is substantially the same as the reference generator 400 shown in FIG. 4, but includes a high-speed logic circuit 510 to handle the phase comparison and switching. The high-speed logic circuit 510 is configured to provide the control signal 425 to phase detector 430 to turn on and off and receives the phase difference signal 435 from the phase detector 430. Logic circuit 510 then generates the control signal 335 to MUX 320 to switch between frequency signals 315A-N and the control signal 415 to MUX 410 to switch between frequency signals 315A-N in response to the phase difference signal 435 indicating that the phase difference is within a threshold phase difference.

The controller 330 provides the control signals 350 to OCXOs 310A-N and a control signal 530 to logic circuit 510. The controller 330 outputs the control signal 530 to logic circuit 510 in response to Tamb 345 being within an overlapping region of the Tops, and causes the logic circuit 510 to power up the phase detector 430 and begin the process of transitioning from one OCXO to another. The high-speed logic circuit 510 can be any appropriate logic circuit, and allows the controller 330 to operate more slowly and use less power because the logic circuit 510 handles the high-speed switching. The logic circuit 510 can be powered off or put in a low-power mode during normal operation when no OCXO switching is anticipated. That is, the power consumption of logic circuit 510 can be reduced while the temperature is not within a predetermined range of the transition thresholds between the OCXOs.

In implementations including the optional PLL 360, the controller 330 outputs a frequency calibration signal 365 to PLL 360 to trim any frequency variations between the OCXOs 310A-N. While transitioning from one OCXO to another, the frequency calibration signal 365 includes the trim values for both the current OCXO and the OCXO to which the reference frequency generator 500 is transitioning. The logic circuit 510 also outputs a control signal 565 to the PLL 360 in response to the phase difference signal 435 indicating the phase difference is within the threshold phase difference. The control signal 565 causes the PLL 360 to use the trim values for the OCXO to which the frequency generator 500 is transitioning.

Figure 6A:
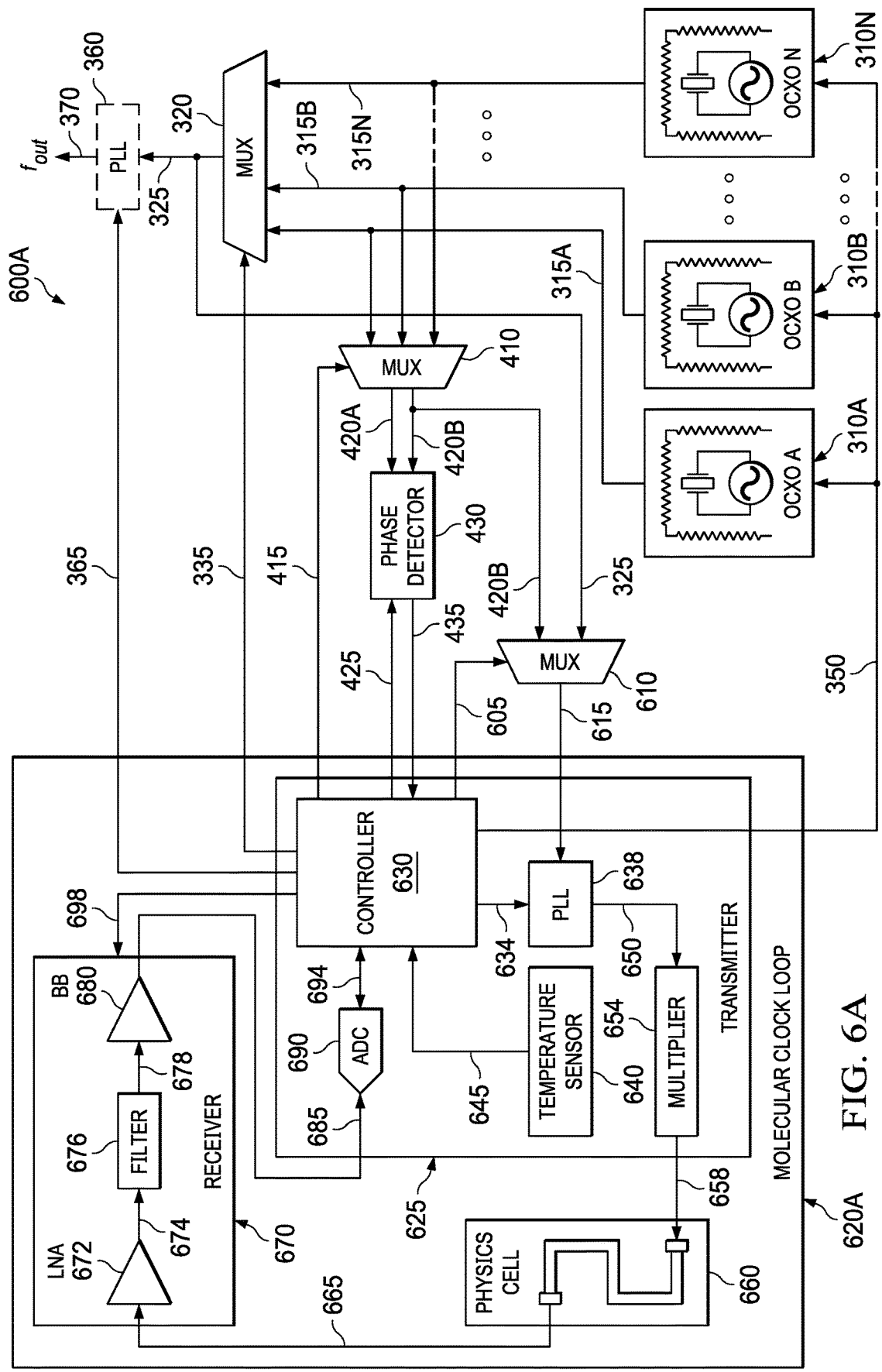
FIG. 6A illustrates the example reference frequency generator including multiple OCXOs and a phase detector shown in FIG. 4 with a molecular clock loop incorporating a controller and a temperature sensor.

FIG. 6A illustrates an example reference frequency generator 600A including multiple OCXOs, a phase detector, and a molecular clock loop 620A incorporating a controller 630 and a temperature sensor 640. The reference frequency generator 600A is similar to the reference generator 400 shown in FIG. 4, but the controller 330 and the temperature sensor 340 are incorporated into the molecular clock loop 620A as controller 630 and temperature sensor 640, respectively. The reference frequency generator 600A also includes a multiplexor 610, which has an input coupled to the output 325 of the MUX 320 and an input coupled to the output 420B of the MUX 410. The MUX 610 receives a control signal 605 from controller 630 and outputs one of the output 325 and the output 420B based on the control signal 605. The output 615 of the MUX 610 is coupled to the molecular clock loop 620A.

The molecular clock loop 620A includes a transmitter 625, a physics cell 660, and a receiver 670. The transmitter 625 includes the controller 630, the temperature sensor 640, a PLL 638, a multiplier 654, and an analog-to-digital converter (ADC) 690. The temperature sensor 640 provides a measured temperature Tamb 645 to the controller 630, which also receives the phase difference signal 435 and provides the control signals 350 to OCXOs 310A-N, the control signal 335 to MUX 320, the control signal 415 to MUX 410, the control signal 425 to phase detector 430, and the frequency calibration signal 365 to optional PLL 360.

The controller 630 provides a control signal 634 to the PLL 638, which also receives the output 615 of the MUX 610 and outputs a frequency signal 650 to the multiplier 654. The multiplier 654 outputs a multiplied frequency signal 658 to the physics cell 660. The physics cell 660 can be a tube or waveguide with a low pressure dipolar gas that undergoes a quantum rotational transition and absorbs an interrogating electromagnetic signal at a specific frequency. The particular gas can be chosen such that the absorption occurs at a particular multiple of an intended frequency of the reference frequency signal fout 370.

The output 665 of the physics cell 660 is provided to an input of the receiver 670, which includes a low noise amplifier (LNA) 672, a filter 676, and a baseband amplifier (BB) 680. The LNA 672 receives the output 665 from the physics cell, and outputs an amplified signal 674 to the filter 676. The filter 676 can be a chi-squared filter in some implementations, and outputs a filtered signal 678. The BB 680 amplifies the filtered signal and outputs the amplified and filtered signal 685 to the ADC 690 in transmitter 625. The digitized signal 694 from the ADC 690 to the controller 630 indicates whether the multiplied frequency signal 658 based on the output 615 from MUX 610 is at the absorption frequency of the physics cell 660.

Based on the digitized signal 694, the controller 630 can implement adjustments to the control signals 350 for the OCXOs 310A-N and to the frequency calibration signal 365 to the optional PLL 360. For example, the molecular clock loop 620A can be used to pre-calibrate the transitioning OCXO and compensate for aging of the OCXOs over time. The control signal 605 causes the MUX 610 to use the output 420B from MUX 410 as the output 615 to the PLL 638. Based on the respective digitized signal 694, the controller 630 can implement adjustments to the control signal 350 for the particular OCXO before the reference signal generator 600A relies on the particular OCXO for the reference frequency signal fout 370.

In implementations including the optional PLL 360, the molecular clock loop 620A can be used to calibrate the reference frequency signal fout 370 as the PLL 360 drifts with temperature changes. The control signal 605 causes the MUX 610 to output the frequency signal 325 from MUX 320 to the PLL 638 in the molecular clock loop 620A. Based on the respective digitized signal 694, the controller 630 can implement adjustments to the frequency calibration signal 365. The molecular clock loop 620A can be used to recalibrate the PLL 360 at regular intervals based on environmental temperature changes or to recalibrate the PLL 360 continuously. The molecular clock loop 620A can be transitioned to a low-power mode of operation between calibrations to reduce power consumption. The molecular clock loop 620A is turned on a sufficient length of time during calibration to average the oscillator frequency for the desired accuracy according to its Allan deviation.

Figure 6B:
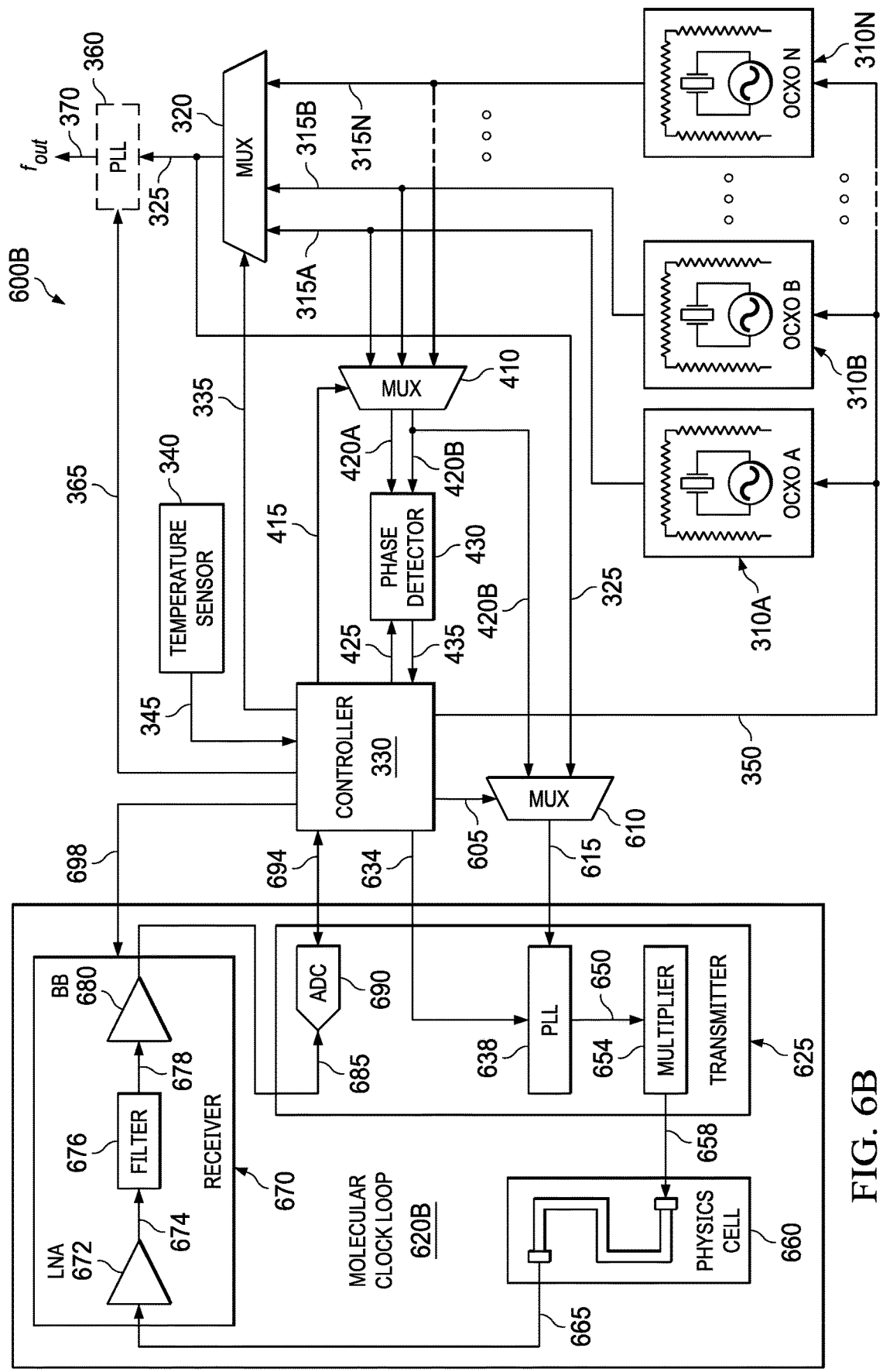
FIG. 6B illustrates the example reference frequency generator including multiple OCXOs, a phase detector, and a molecular clock loop shown in FIG. 6A with an external controller and temperature sensor.

FIG. 6B illustrates an example reference frequency generator 600B is similar to the reference generator 600A shown in FIG. 6A, but includes the controller 330 and the temperature sensor 340 separate from the molecular clock loop 620B, which omits the controller 630 and temperature sensor 640. The reference frequency generator 600B operates in largely the same manner as the reference frequency generator 600A, but having the controller 330 and temperature sensor 340 separate from the molecular clock loop 620B gives flexibility to turn off the molecular clock loop 620B when not in use to conserve power without also turning off the controller 330 and temperature sensor 340. In reference frequency generator 620B, the temperature sensor 340 is able to continue measuring the temperature of the environment Tamb 345, and the controller 330 is able to manage the OCXOs 310A-N while the molecular clock loop 620B is turned off.

Figure 7:
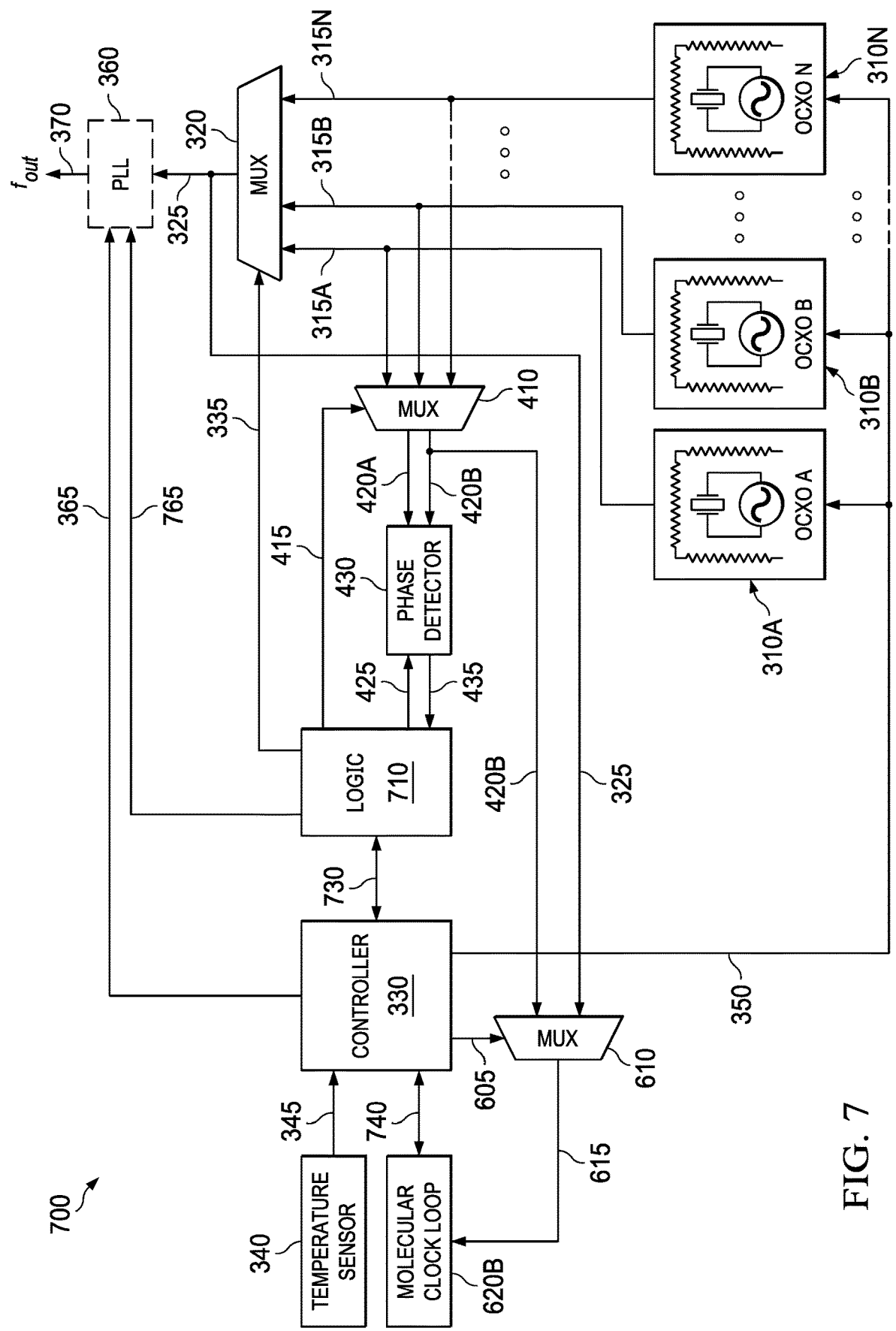
FIG. 7 illustrates the example reference frequency generator including multiple OCXOs, a phase detector, and a molecular clock loop shown in FIG. 6B with a high-speed logic circuit.

FIG. 7 illustrates the example reference frequency generator 700 including multiple OCXOs, a phase detector, a molecular clock loop and a high-speed logic circuit. The reference frequency generator 700 is similar to the reference frequency generator 600B shown in FIG. 6B, but also includes a high-speed logic circuit 710 to handle the phase comparison and OCXO switching. For ease of illustration, the molecular clock loop 620B is shown as a simplified circuit 620B, and the communications between the controller 330 and the molecular clock loop 620B are shown as communications 740.

The high-speed logic circuit 710 is configured to provide the control signal 425 to phase detector 430 to turn on and off and receives the phase difference signal 435 from the phase detector 430. Logic circuit 710 then generates the control signal 335 to MUX 320 to switch between frequency signals 315A-N and the control signal 415 to MUX 410 to switch between frequency signals 315A-N in response to the phase difference signal 435 indicating that the phase difference is within a threshold phase difference, that is, when the phases accidentally align at the beat frequencies of the OCXOs 310. The logic circuit 710 can be powered off or put in a low-power mode during normal operation when no OCXO switching is anticipated. That is, the power consumption of logic circuit 710 can be reduced while the temperature is not within a predetermined range of the transition thresholds between the OCXOs.

The controller 330 provides the control signals 350 to OCXOs 310A-N and a control signal 730 to logic circuit 710. The controller 330 outputs the control signal 730 to logic circuit 710 in response to Tamb 345 being within an overlapping region of the Tops, and causes the logic circuit 710 to power up the phase detector 430 and begin the process of transitioning from one OCXO to another. The high-speed logic circuit 710 can be any appropriate logic circuit, and allows the controller 330 to operate more slowly and use less power because the logic circuit 710 handles the high-speed switching.

In implementations including the optional PLL 360, the controller 330 outputs a frequency calibration signal 365 to PLL 360 to trim any frequency variations between the OCXOs 310A-N. While transitioning from one OCXO to another, the frequency calibration signal 365 includes the trim values for both the current OCXO and the OCXO to which the reference frequency generator 700 is transitioning. The logic circuit 710 also outputs a control signal 765 to the PLL 360 in response to the phase difference signal 435 indicating the phase difference is within the threshold phase difference. The control signal 765 causes the PLL 360 to use the trim values for the OCXO to which the frequency generator 700 is transitioning.

Figure 8A:
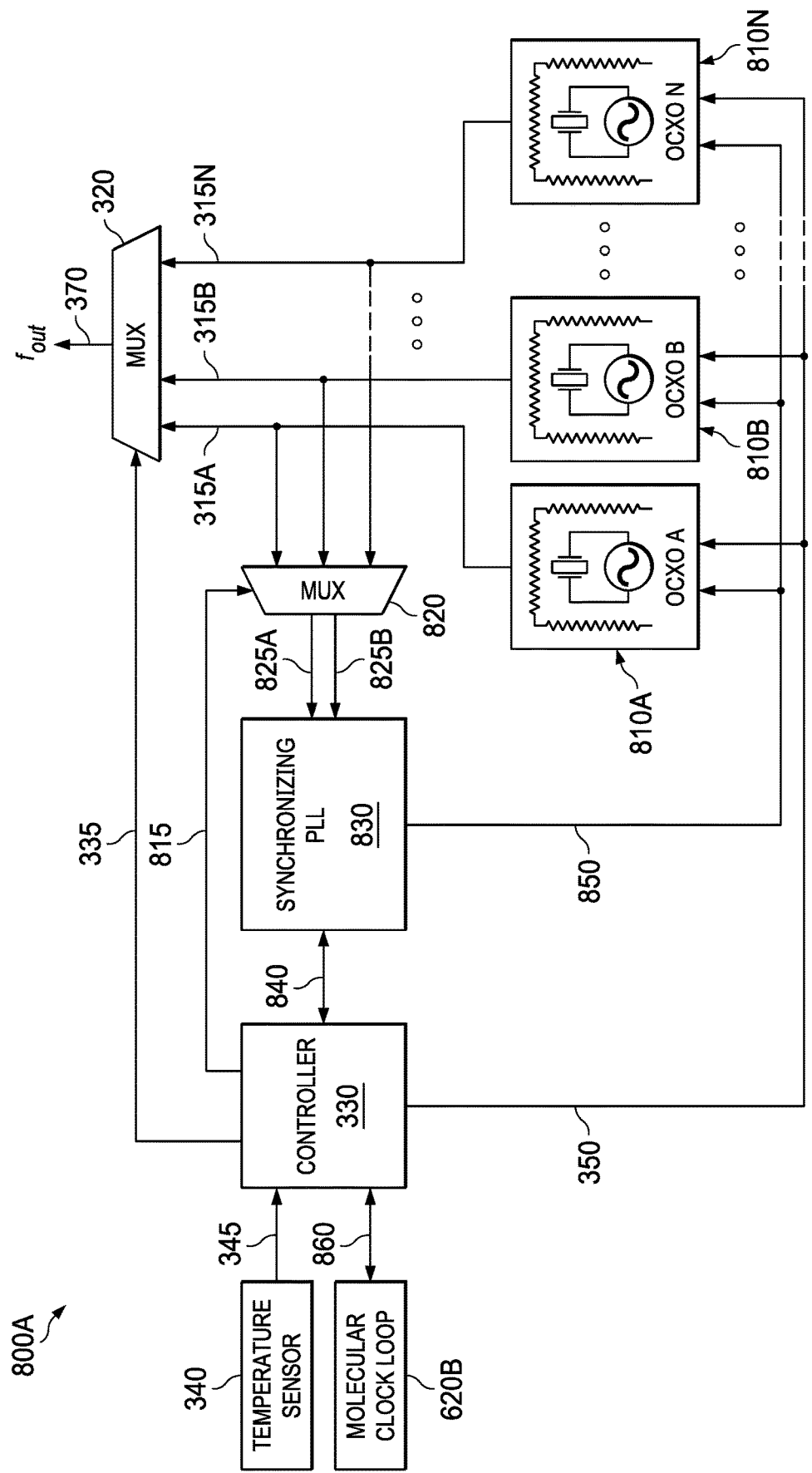
FIGS. 8A-B illustrate example reference frequency generators including multiple tunable OCXOs, a molecular clock loop, and a synchronizing phase-locked loop (PLL).
Figure 8B:
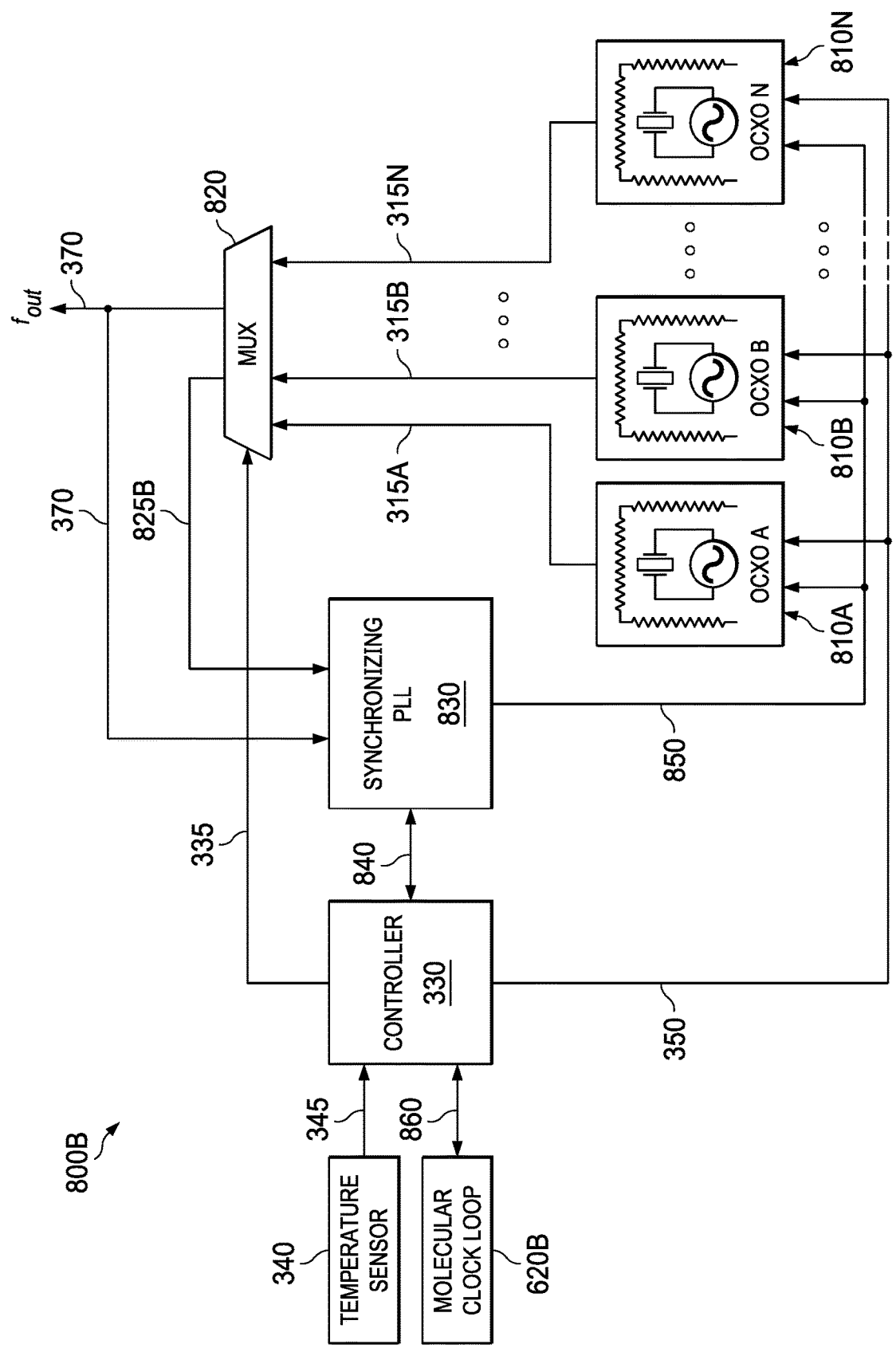

FIGS. 8A-B illustrate an example reference frequency generator 800 including multiple tunable OCXOs 810A-N, an optional molecular clock loop, and a synchronizing phase-locked loop (PLL) 830. For ease of illustration, reference frequency generator 800 is described with reference to the reference frequency generator 300 shown in FIG. 3 and the molecular clock loop 620B shown in FIG. 6B. For ease of illustration, the molecular clock loop 620B is shown as a simplified circuit 620B, and the communications between the controller 330 and the molecular clock loop 620B are shown as communications 860.

The tunable OCXOs 810A-N are similar to the OCXOs 310A-N in reference frequency generator 300, but are specifically tunable and receive a control signal 850 from the synchronizing PLL 830 as well as the control signal 350 from the controller 330. The outputs of the tunable OCXOs 810A-N provide the respective frequency signals 315A-N and are coupled to inputs of MUX 320, which can be a glitch-free MUX in some examples. The MUX 320 selects a particular tunable OCXO 810 based on the control signal 335 from the controller 330 and outputs the respective frequency signal 315 as the output frequency signal fout 370.

In the reference frequency generator 800A shown in FIG. 8A, the outputs of the tunable OCXOs 810A-N are also coupled to inputs of MUX 820, which receives a control signal 815 from controller 330 and has two outputs 825A and 825B. Output 825A is used to provide the particular frequency signal 315 from the particular tunable OCXO 810 that is currently being output from MUX 320 as the output 370. For output 825B, MUX 820 outputs the frequency signal 315 that corresponds to the tunable OCXO 810 to which the reference frequency generator 800A is transitioning. The outputs 825A-B are provided to the synchronizing PLL 830, which can be an injection locking loop in some examples. The synchronizing PLL 830 compares the output 825A respective to the frequency signal 315 from the tunable OCXO 810 that is currently used to generate fout 370 with the output 825B respective to the frequency signal 315 from the tunable OCXO 810 to which the reference frequency generator 800 is transitioning. The synchronizing PLL 830 outputs adjustments to the tunable OCXO 810 to which the reference frequency generator 800 is transitioning via control signal 850, and tunes the phase and frequency of the respective frequency signal 315 to the frequency signal 315 currently used to generate the reference frequency signal fout 370.

In the reference frequency generator 800B shown in FIG. 8B, MUX 820 is used in place of MUX 320 and receives the control signal 335 from controller 330. The first output of MUX 820 provides the reference frequency signal fout 370, and the second output 825B of MUX 820 provides the frequency signal 315 from the particular tunable OCXO 810 to which the reference frequency generator 800B is transitioning. The outputs 370 and 825B are provided to the synchronizing PLL 830, which can be an injection locking loop in some examples. The synchronizing PLL 830 compares fout 370 with the output 825B respective to the frequency signal 315 from the tunable OCXO 810 to which the reference frequency generator 800 is transitioning. The synchronizing PLL 830 outputs adjustments to the tunable OCXO 810 to which the reference frequency generator 800 is transitioning via control signal 850, and tunes the phase and frequency of the respective frequency signal 315 to the frequency signal 315 currently used to generate the reference frequency signal fout 370.

For example, at a first time, the tunable OCXO 810A provides the frequency signal 315A, and the control signal 335 causes MUX 320 to output frequency signal 315A as fout 370. In implementations including the optional molecular clock loop 620B, the molecular clock loop 620B can be used to continuously calibrate the tunable OCXO 810A and the frequency signal 315A. At a second time, the environmental temperature increases into the overlapping Tops of tunable OCXO 810A and tunable OCXO 810B. Controller 330 causes tunable OCXO 810B to turn on, and molecular clock loop 620B calibrates the frequency, oven temperature, and phase noise of the tunable OCXO 810B.

At a third time after the frequency, oven temperature, and phase noise has been tuned by the molecular clock loop 620B, the controller 330 wakes up the synchronizing PLL 830 through communications 840. The synchronizing PLL 830 synchronizes the tunable OCXO 810B to the tunable OCXO 810A, and once the frequency and phase of 315B and 315A are within a threshold difference, the control signal 335 causes the MUX 320 in reference frequency generator 800A or the MUX 820 in reference frequency generator 800B to output the frequency signal 315B from tunable OCXO 810B instead of the frequency signal 315A from tunable OCXO 810A. The synchronizing PLL 830 and the tunable OCXO 810A can be powered off to conserve power.

Figure 9:
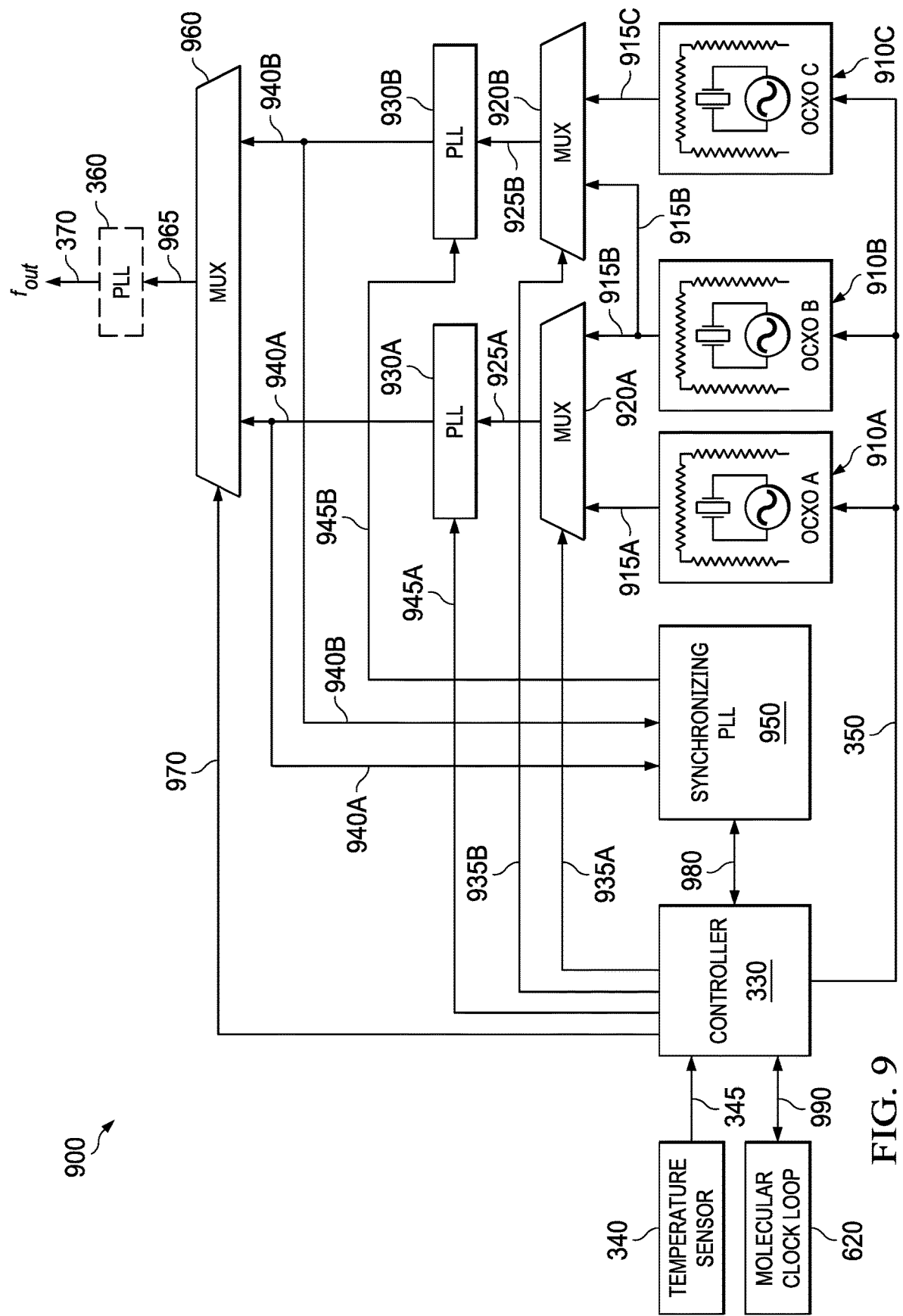
FIG. 9 illustrates an example reference frequency generator including multiple non-tunable OCXOs, a molecular clock loop, and a synchronizing PLL.

FIG. 9 illustrates an example reference frequency generator 900 including multiple non-tunable OCXOs 910A-C, an optional molecular clock loop, and a synchronizing PLL 950. For ease of explanation, reference frequency generator 900 is described with reference to the reference frequency generator 300 shown in FIG. 3 and the molecular clock loop 620B shown in FIG. 6B. For ease of illustration, the molecular clock loop 620B is shown as a simplified circuit 620B, and the communications between the controller 330 and the molecular clock loop 620B are shown as communications 990. The non-tunable OCXOs 910A-C are similar to the OCXOs 310A-N in reference frequency generator 300, but are specifically non-tunable.

The outputs of the non-tunable OCXOs 910A-C provide the respective frequency signals 915A-C and are coupled to inputs of MUXs 920A-B, which can be glitch-free MUXs in some examples. The MUX 920A receives the frequency signal 915A from non-tunable OCXO 910A and the frequency signal 915B from non-tunable OCXO 910B. The MUX 920A also receives a control signal 935A from controller 330, and outputs one of the frequency signals 915A or 915B as the output 925A based on the control signal 935A. The MUX 920B receives the frequency signal 915B from non-tunable OCXO 910B and the frequency signal 915C from non-tunable OCXO 910C. The MUX 920B also receives a control signal 935B from controller 330, and outputs one of the frequency signals 915B or 915C as the output 925B based on the control signal 935B.

The output 925A of MUX 920A is coupled to an input of PLL 930A, which also receives a first frequency calibration signal 945A from controller 330. The output 940A of PLL 930A is coupled to an input of MUX 960 and to synchronizing PLL 950. The output 925B of MUX 920B is coupled to an input of PLL 930B, which also receives a second frequency calibration signal 945B from synchronizing PLL 950. The output 940B of PLL 930 A is coupled to another input of MUX 960 and to synchronizing PLL 950. In some implementations, either the controller 330 or the synchronizing PLL 950 can provide the first frequency calibration signal 945A to the PLL 930A, and either the controller 330 or the synchronizing PLL 950 can provide the second frequency calibration signal 945B to the PLL 930B.

The MUX 960 receives the outputs 940A and 9406, and a control signal 970 from controller 330. MUX 960 outputs one of output 940A and 940B as the output 965 based on the control signal 970. In implementations without the optional PLL 360, the output 965 from MUX 960 is the reference frequency signal fout 370. In implementations with the optional PLL 360, the output 965 of MUX 960 is provided to an input of PLL 360, and the output of PLL 360 is the reference frequency signal fout 370.

The synchronizing PLL 950 and molecular clock loop 620 can be powered off or put in low-power modes during normal operation when no OCXO switching and calibrating is anticipated. That is, the power consumption of synchronizing PLL 950 and molecular clock loop 620 can be reduced while the temperature is not within a predetermined range of the transition thresholds between the OCXOs.

For example, at a first time, the non-tunable OCXO 910A provides the frequency signal 915A, and the control signal 935A causes MUX 920A to output frequency signal 915A as the output 925A. The PLL 930A performs frequency calibration indicated by control signal 945A from controller 330 and outputs the adjusted frequency signal 940A to MUX 960 and to the synchronizing PLL 950. The control signal 970 causes MUX 960 to output the adjusted frequency signal 940A as the output 965 and fout 370. In implementations including the optional molecular clock loop 620B, molecular clock loop 620B can be used to continuously calibrate the non-tunable OCXO 910A and the frequency signal 915A through adjustments to the frequency calibration indicated by control signal 945A from controller 330.

At a second time, the environmental temperature increases into the overlapping Tops of non-tunable OCXO 910A and non-tunable OCXO 910B. Controller 330 causes non-tunable OCXO 910B to turn on, and causes MUX 920B to output frequency signal 9156 from non-tunable OCXO 9106 as the output 925B. The PLL 930B performs frequency calibration indicated by control signal 945B from controller 330 and outputs the adjusted frequency signal 940B to MUX 960 and the synchronizing PLL 950. The control signal 970 causes MUX 960 to continue outputting the adjusted frequency signal 940A as the output 965 and fout 370. Molecular clock loop 620B can be used to calibrate the non-tunable OCXO 910B and the frequency signal 915B through adjustments to the frequency calibration indicated by control signal 945B from controller 330.

After the non-tunable OCXO 9106 is calibrated, the controller 330 causes the synchronizing PLL 950 to wake up via communications 980. The synchronizing PLL 950 then synchronizes the output 940A from PLL 930A and the output 940B from PLL 930B, such that the frequency and phases of outputs 940A and 940B are within a threshold difference. In response to the frequency and phases of outputs 940A and 940B being within the threshold difference, the controller 330 outputs the control signal 970 to cause MUX 960 to output the output 940B as the output 965 and fout 370. The controller 330 then causes the non-tunable OCXO 910A and the synchronizing PLL 950 to power down to conserve power. The controller 330 provides the second frequency calibration signal 945B to the PLL 930B after the synchronizing PLL 950 is powered down. At the next temperature transition between non-tunable OCXO 910B and another non-tunable OCXO 910, the synchronizing PLL 950 provides the first frequency calibration signal 945A to the PLL 930A to synchronize the frequency and phases of outputs 940A and 940B.

Reference frequency generator 900 includes three non-tunable OCXOs 910A-C, but any number N of non-tunable OCXOs 910 can be used. N−1 MUXs 920 and PLLs 930 are used, and the MUX 960 has N−1 inputs and the input for control signal 970. MUXs 20 and 960 can be glitch free MUXs in some implementations. PLLs 930A and 930B are shown as PLLs in this example, but fractional output dividers can be used in other implementations.

In this description, FIGS. 3-9 include multiplexors, which can be glitch free multiplexors in some implementations, but any appropriate selector logic circuit can be used in place of the multiplexors.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

Unless otherwise stated, "about," "approximately," or "substantially" preceding a value means+/−10 percent of the stated value. Modifications are possible in the described examples, and other examples are possible within the scope of the claims.

What is claimed is:

1. A reference frequency signal generator, comprising:
    a first ovenized reference crystal oscillator (OCXO) having a first turn-over-temperature (TOT), the first OCXO having an input and an output;
    a second OCXO having a second TOT, the second TOT being different than the first TOT, the second OCXO having an input and an output;
    a selector logic circuit having inputs coupled to the outputs of the first and second OCXOs, the selector logic circuit further having a control signal input and a selector logic circuit output;
    a temperature sensor having a temperature sensor output; and
    a controller having an input coupled to the temperature sensor output, a first output coupled to the inputs of the first and second OCXOs, and a second output coupled to the control signal input.

2. The reference frequency signal generator of claim 1, further comprising a phase-locked loop (PLL) having an input coupled to the selector logic circuit output and a calibration signal input, wherein the controller further comprises a third output coupled to the calibration signal input.

3. The reference frequency signal generator of claim 1, further comprising a fractional output divider having an input coupled to the selector logic circuit output and a calibration signal input, wherein the controller further comprises a third output coupled to the calibration signal input.

4. The reference frequency signal generator of claim 1, wherein the selector logic circuit is a first selector logic circuit, the control signal input is a first control signal input, and the selector logic circuit output is a first selector logic circuit output, the reference frequency signal generator further comprising:
    a second selector logic circuit having inputs coupled to the outputs of the first and second OCXOs, the second selector logic circuit further having a second control signal input, a second selector logic circuit output, and a third selector logic circuit output; and
    a phase detector having a first input coupled to the second selector logic circuit output, a second input coupled to the third selector logic circuit output, a control signal input, and an output;
    wherein the controller further comprises a third output coupled to the second control signal input, a fourth output coupled to the control signal input of the phase detector, and an input coupled to the output of the phase detector.

5. The reference frequency signal generator of claim 4, further comprising a logic circuit having a first input, a second input coupled to the output of the phase detector, a first output coupled to the first control signal input, a second output coupled to the second control signal input, and a third output coupled to the control signal input of the phase detector, wherein the controller further comprises a fifth output coupled to the first input of the logic circuit.

6. The reference frequency signal generator of claim 5, further comprising a phase-locked loop (PLL) having an input coupled to the first selector logic circuit output, a calibration signal input, and a switching signal input, wherein the controller further comprises a sixth output coupled to the calibration signal input, and wherein the logic circuit further comprises a fourth output coupled to the switching signal input.

7. The reference frequency signal generator of claim 5, further comprising a fractional output divider having an input coupled to the first selector logic circuit output, a calibration signal input, and a switching signal input, wherein the controller further comprises a sixth output coupled to the calibration signal input, and wherein the logic circuit further comprises a fourth output coupled to the switching signal input.

8. The reference frequency signal generator of claim 4, further comprising:
    a third selector logic circuit having a first input coupled to the first selector logic circuit output, a second input coupled to the third selector logic circuit output, a third control signal input, and a fourth selector logic circuit output; and
    a molecular clock loop having a first input coupled to the third selector logic circuit output, a second input, and a molecular clock loop output;
    wherein the input of the controller is a first input of the controller, and wherein the controller further comprises a fifth output coupled to the third control signal input, a sixth output coupled to the second input of the molecular clock loop, and a second input coupled to the molecular clock loop output.

9. The reference frequency signal generator of claim 8, wherein the molecular clock loop further comprises the controller and the temperature sensor.

10. The reference frequency signal generator of claim 8, further comprising a logic circuit having a first input, a second input coupled to the output of the phase detector, a first output coupled to the first control signal input, a second output coupled to the second control signal input, and a third output coupled to the control signal input of the phase detector, wherein the controller further comprises a seventh output coupled to the first input of the logic circuit.

11. The reference frequency signal generator of claim 1, wherein the selector logic circuit is a first selector logic circuit, the control signal input is a first control signal input, the selector logic circuit output is a first selector logic circuit output, and the inputs of the first and second OCXOs comprise first inputs of the first and second OCXOs, the reference frequency signal generator further comprising:
    a second selector logic circuit having inputs coupled to the outputs of the first and second OCXOs, a second control signal input, a second selector logic circuit output, and a third selector logic circuit output; and
    a synchronizing phase-locked loop (PLL) having a first input coupled to the second selector logic circuit output, a second input coupled to the third selector logic circuit output, a first output, and a communications bus coupled to the controller;
    wherein the first and second OCXOs further comprise second inputs coupled to the first output of the synchronizing PLL, wherein the controller further comprises a third output coupled to the second control signal input.

12. The reference frequency signal generator of claim 11, wherein the first and second OCXOs comprise a first tunable OCXO and a second tunable OCXO.

13. A system, comprising:
a first ovenized reference crystal oscillator (OCXO) having a first input and a first output;
a second OCXO having a second input and a second output;
a third OCXO having a third input and a third output;
a first logic circuit having a first logic input coupled to the first output, a second logic input coupled to the second output, a first control input, and a first logic output;
a second logic circuit having a third logic input coupled to the second output, a fourth logic input coupled to the third output, a second control input, and a second logic output;
a first phase-locked loop (PLL) having a first PLL input coupled to the first logic output, a second PLL input, and a first PLL output;
a second PLL having a third PLL input coupled to the second logic output, a fourth PLL input, and a second PLL output;
a third logic circuit having a fifth logic input coupled to the first PLL output, a sixth logic input coupled to the second PLL output, a third control input, and a third logic output;
a third PLL having a fifth PLL input coupled to the first PLL output, a sixth PLL input coupled to the second PLL output, a communications bus, and a third PLL output coupled to the fourth PLL input;
a temperature sensor having a temperature sensor output; and
a controller coupled to the communications bus, the controller having:
a first input coupled to the temperature sensor output,
a first output coupled to the first, second, and third inputs,
a second output coupled to the first control input,
a third output coupled to the second control input,
a fourth output coupled to the second PLL input, and
a fifth output coupled to the third control input.

14. The system of claim 13, further comprising a molecular clock loop coupled to the controller.

15. The system of claim 13, further comprising a fourth PLL having a seventh PLL input coupled to the third logic output and an output.

16. The system of claim 13, further comprising a fractional output divider having an input coupled to the third logic output and an output.

17. A device, comprising:
a first and a second ovenized reference crystal oscillator (OCXO), the first and second OCXOs having different turn-over-temperatures (TOTs);
a selector logic circuit coupled to the first and second OCXOs and configured to output a particular OCXO output based on a control signal;
a temperature sensor configured to measure an environmental temperature of the device; and
a controller configured to:
receive the environmental temperature from the temperature sensor;
determine the environmental temperature is within an operating temperature range of a particular OCXO of the first and the second OCXO based on the respective TOT;
cause the particular OCXO to generate the particular OCXO output; and
generate the control signal to cause the selector logic circuit to output the particular OCXO output.

18. The device of claim 17, further comprising a phase-locked loop configured to calibrate the particular OCXO output based on a calibration signal, wherein the controller is further configured to generate the calibration signal based on a trim value associated with the particular OCXO.

19. The device of claim 17, wherein the particular OCXO is a first particular OCXO and the particular OCXO output is a first particular OCXO output, wherein the controller is further configured to:
receive an updated environmental temperature from the temperature sensor;
determine the updated environmental temperature is within the operating temperature range of the first particular OCXO and within an operating temperature range of a second particular OCXO based on the respective TOT;
cause the second particular OCXO to turn on;
cause the second particular OCXO to generate a second particular OCXO output; and
generate the control signal to cause the selector logic circuit to output the second particular OCXO output.

20. The device of claim 19, wherein the controller is further configured to cause the first particular OCXO to turn off.

21. The device of claim 19, wherein the selector logic circuit is a first selector logic circuit and the control signal is a first control signal, the device further comprising:
a second selector logic circuit coupled to the first and second OCXOs and configured to output the first particular OCXO output and the second particular OCXO output based on a second control signal; and
a phase detector configured to receive the first and the second particular OCXO outputs from the second selector logic circuit and generate a phase difference signal;
wherein the controller is further configured to:
generate the second control signal to cause the second selector logic circuit to output the first and second particular OCXO outputs;
receive the phase difference signal;
generate the first control signal to cause the first selector logic circuit to output the second particular OCXO output in response to the phase difference signal satisfying a threshold criterion.

22. The device of claim 21, wherein the controller is further configured to cause the phase detector to turn off.

23. The device of claim 21, further comprising:
a third selector logic circuit configured to output one of an output of the first selector logic circuit and an output of the second selector logic circuit based on a third control signal; and
a molecular clock loop coupled to an output of the third selector logic circuit and configured to generate a frequency calibration signal;
wherein the controller is further configured to:
generate the third control signal to cause the third selector logic circuit to output one of the output of the first selector logic circuit and the output of the second selector logic circuit;

receive the frequency calibration signal;
adjust one of a first operating parameter of the first particular OCXO and a second operating parameter of the second particular OCXO.

24. The device of claim 19, wherein the selector logic circuit is a first selector logic circuit and the control signal is a first control signal, the device further comprising:
a second selector logic circuit coupled to the first and second OCXOs and configured to output the second particular OCXO output based on a second control signal; and
a synchronizing phase-locked loop (PLL) configured to synchronize a frequency and a phase of the first and the second particular OCXO outputs;
wherein the controller is further configured to:
generate the second control signal to cause the second selector logic circuit to output the second particular OCXO output;
generate the first control signal to cause the first selector logic circuit to output the second particular OCXO output in response to the frequency and the phase of the first and second particular OCXO outputs being synchronized.

* * * * *